(12) United States Patent
Peng et al.

(10) Patent No.: US 9,941,214 B2
(45) Date of Patent: Apr. 10, 2018

(54) SEMICONDUCTOR DEVICES, METHODS OF MANUFACTURE THEREOF, AND INTER-METAL DIELECTRIC (IMD) STRUCTURES

(71) Applicant: Taiwan Semiconductor Manufacturing Company, Ltd., Hsin-Chu (TW)

(72) Inventors: Yu-Yun Peng, Hsin-Chu (TW); Keng-Chu Lin, Chao-Chou Ping-Tung (TW); Joung-Wei Liou, Zhudong Town (TW); Kuang-Yuan Hsu, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 28 days.

(21) Appl. No.: 13/968,174

(22) Filed: Aug. 15, 2013

(65) Prior Publication Data

US 2015/0048488 A1 Feb. 19, 2015

(51) Int. Cl.
| | |
|---|---|
| *H01L 23/532* | (2006.01) |
| *H01L 21/768* | (2006.01) |
| *H01L 21/02* | (2006.01) |
| *H01L 21/3105* | (2006.01) |
| *H01L 23/528* | (2006.01) |

(52) U.S. Cl.
CPC .. *H01L 23/53295* (2013.01); *H01L 21/02126* (2013.01); *H01L 21/02203* (2013.01); *H01L 21/02216* (2013.01); *H01L 21/02274* (2013.01); *H01L 21/02348* (2013.01); *H01L 21/3105* (2013.01); *H01L 21/76801* (2013.01); *H01L 21/76825* (2013.01); *H01L 21/76829* (2013.01); *H01L 21/76832* (2013.01); *H01L 21/76835* (2013.01); *H01L 23/5283* (2013.01); *H01L 23/53238* (2013.01); *H01L 2924/0002* (2013.01)

(58) Field of Classification Search
CPC ......... H01L 29/94; H01L 21/31; H01L 21/28; H01L 23/29; H01L 21/44
See application file for complete search history.

(56) References Cited

U.S. PATENT DOCUMENTS

| | | | |
|---|---|---|---|
| 2001/0033026 A1* | 10/2001 | Nakata ................. | C09D 183/04 257/759 |
| 2003/0157794 A1* | 8/2003 | Agarwala ......... | H01L 21/76801 438/627 |
| 2007/0057305 A1* | 3/2007 | Oates et al. .................. | 257/301 |
| 2009/0176367 A1* | 7/2009 | Baks ..................... | H01L 21/312 438/654 |
| 2011/0079799 A1* | 4/2011 | Lee ........................... | C09J 7/02 257/91 |
| 2013/0032955 A1* | 2/2013 | Liou et al. .................... | 257/787 |
| 2013/0043514 A1 | 2/2013 | Grill et al. | |

* cited by examiner

*Primary Examiner* — Fernando L Toledo
*Assistant Examiner* — Lawrence-Linh T Nguyen
(74) *Attorney, Agent, or Firm* — Slater Matsil, LLP

(57) ABSTRACT

Semiconductor devices, methods of manufacture thereof, and IMD structures are disclosed. In some embodiments, a semiconductor device includes an adhesion layer disposed over a workpiece. The adhesion layer has a dielectric constant of about 4.0 or less and includes a substantially homogeneous material. An insulating material layer is disposed over the adhesion layer. The insulating material layer has a dielectric constant of about 2.6 or less. The adhesion layer and the insulating material layer comprise an IMD structure.

19 Claims, 5 Drawing Sheets

SEMICONDUCTOR DEVICES, METHODS OF MANUFACTURE THEREOF, AND INTER-METAL DIELECTRIC (IMD) STRUCTURES

BACKGROUND

Semiconductor devices are used in a variety of electronic applications, such as personal computers, cell phones, digital cameras, and other electronic equipment, as examples. Semiconductor devices are typically manufactured by providing a workpiece, forming various material layers over the workpiece, and patterning the various material layers using lithography to form integrated circuits.

The semiconductor industry continues to improve the integration density of various electronic components of integrated circuits, i.e., transistors, diodes, resistors, capacitors, etc., by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (k) materials and extra-low k (ELK) materials that have dielectric constants less than that of silicon dioxide have begun to be implemented in some designs as insulating materials between interconnects.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to manufacturing methods and structures for semiconductor devices. Semiconductor devices and methods of manufacture thereof will be described herein that comprise novel structures and methods of forming hybrid inter-metal dielectric (IMD) structures and schemes that include an adhesion layer with a low dielectric constant.

Figure 1:
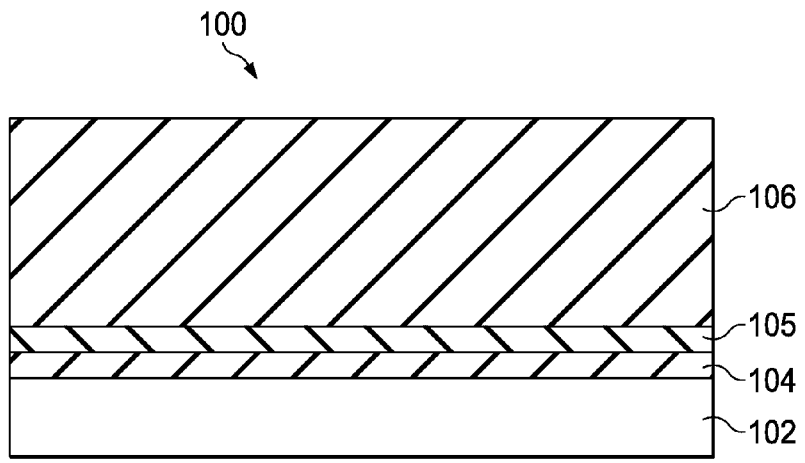
FIGS. 1 through 3 illustrate cross-sectional views of a semiconductor device at various stages of manufacturing in accordance with some embodiments of the present disclosure.
Figure 2:
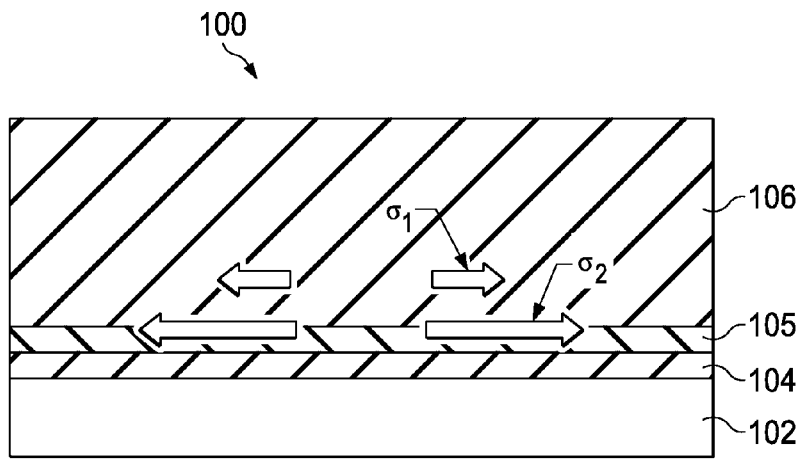
Figure 3:
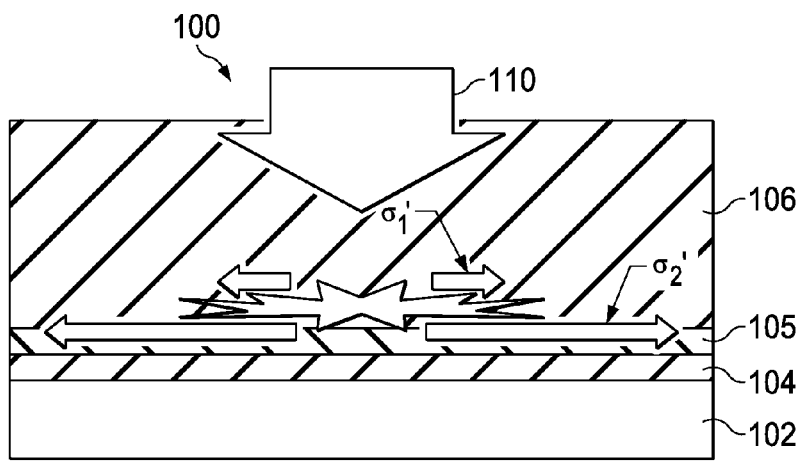

FIGS. 1 through 3 illustrate cross-sectional views of a semiconductor device 100 at various stages of manufacturing in accordance with some embodiments of the present disclosure. Referring first to FIG. 1, there is shown a cross-sectional view of the semiconductor device 100. To manufacture the semiconductor device 100, a workpiece 102 is provided. The workpiece 102 may include a semiconductor substrate or wafer comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

An etch stop layer 104 is deposited or formed over the workpiece 102, as shown in FIG. 1. The etch stop layer 104 comprises a material with an etch selectivity to subsequently deposited material layers, such as insulating material layer 106 and adhesion layer 105. The etch stop layer 104 comprises a material that etches more slowly that insulating material layer 106 or adhesion layer 105, for example. The etch stop layer 104 comprises an insulating material comprising two or more combinations of materials such as Si, C, N, O, H, or B in some embodiments, for example. The etch stop layer 104 comprises a silicon compound such as silicon oxide, silicon nitride, silicon carbide, silicon boride, or a metal compound such as aluminum oxide, aluminum nitride, other materials, or multiple layers or combinations thereof in some embodiments, as examples. The etch stop layer 104 comprises a thickness of about 25 Angstroms to about 500 Angstroms in some embodiments. Alternatively, the etch stop layer 104 may comprise other dimensions and materials. The etch stop layer 104 may be formed using chemical vapor deposition (CVD), physical vapor deposition (PVD), or other methods.

An adhesion layer 105 is deposited or formed over the etch stop layer 104, as shown in FIG. 1. The adhesion layer 105 has a dielectric constant of about 4.0 or less in some embodiments. In some embodiments, the adhesion layer 105 has a dielectric constant of about 2.6, as an example. Alternatively, the dielectric constant of the adhesion layer 105 may comprise other values. The adhesion layer 105 comprises an oxide or a carbon-doped oxide in some embodiments. The adhesion layer 105 comprises SiOH:C in some embodiments. The adhesion layer 105 comprises a thickness of about 50 Angstroms to about 250 Angstroms in some embodiments. The adhesion layer 105 comprises a thickness of about 150 Angstroms in some embodiments, as an example. Alternatively, the adhesion layer 105 may comprise other materials and dimensions, in other embodiments.

The adhesion layer 105 comprises a substantially homogeneous material in some embodiments; e.g., the adhesion layer 105 comprises substantially the same composition or substantially the same chemical structure throughout the entire thickness of the adhesion layer 105. The adhesion layer 105 is not graded in accordance with some embodiments, for example. The adhesion layer 105 is porous, in some embodiments. In other embodiments, the adhesion layer 105 is non-porous. The adhesion layer 105 comprises a porosity of about 20% or less, in some embodiments, for example. In embodiments wherein the adhesion layer 105 is non-porous, the porosity of the adhesion layer 105 is about 0%, as an example. Alternatively, the adhesion layer 105 may comprise other levels of porosity and may comprise other material composition properties, in other embodiments. The adhesion layer 105 comprises a material that is adapted to improve adhesion of the subsequently deposited insulating material layer 106 to the etch stop layer 104.

The adhesion layer 105 is formed using plasma enhanced chemical vapor deposition (PECVD) process in some embodiments. The PECVD process may comprise two precursors. For example, the PECVD process may comprise an alkoxysilane-based group precursor and a porogen material precursor. The alkoxysilane-based group precursor is adapted to form a majority of Si—O bonds, in some embodiments, for example. The porogen material precursor may comprise an ultraviolet (UV)-sensitive alkyl-based group precursor, as an example. The UV-sensitive alkyl-based group precursor of the porogen material precursor is decomposed after UV energy exposure and is adapted to form pores, creating a lower dielectric constant material, for example. Alternatively, the PECVD process may comprise other precursors, properties, and parameters, and other methods may be used to form the adhesion layer 105.

The insulating material layer 106 is deposited or formed over the adhesion layer 105, also shown in FIG. 1. The insulating material layer 106 comprises SiOH:C in some embodiments. The insulating material layer 106 comprises a thickness of about 300 Angstroms to about 1,000 Angstroms, as examples. The insulating material layer 106 has a dielectric constant of about 2.6 or less in some embodiments, for example. In some embodiments, the insulating material layer 106 has a dielectric constant of about 2.3. The insulating material layer comprises a porosity of about 5% to about 30% in some embodiments. Alternatively, the insulating material layer 106 may comprise other materials, dimensions, dielectric constants, and porosity levels.

The insulating material layer 106 is formed using PECVD in some embodiments. The insulating material layer 106 may be formed using the same PECVD process that was used to form the adhesive layer 105, for example. The PECVD process used to form the adhesive layer 105 may be altered to achieve different properties for the insulating material layer 106, such as the porosity and/or the dielectric constant, for example. Alternatively, the insulating material layer 106 may be formed using other methods or other PECVD methods. In some embodiments, the insulating material layer 106 is formed in the same processing chamber that the adhesion layer 105 is formed, without removing the workpiece 102 from the chamber. The insulating material layer 106 is formed in the same PECVD chamber that the adhesion layer 105 is formed in, in some embodiments, for example. The insulating material layer 106 is formed using the same precursors used to form the adhesion layer 105 in some embodiments. The parameters of the PECVD process are altered to form the insulating material layer 106 having different properties than the adhesion layer 105 in some embodiments.

The insulating material layer 106 comprises the same material as the adhesion layer 105 in some embodiments, for example. The adhesion layer 105 is denser and less porous than the insulating material layer 106 and has a higher dielectric constant than the insulating material layer 106 in some embodiments. In embodiments wherein the adhesion layer 105 and the insulating material layer 106 both comprise SiOH:C, the adhesion layer 105 has more Si—O bonds and has a lower carbon content than the insulating material layer 106 in some embodiments. Alternatively, the adhesion layer 105 and insulating material layer 106 may have other properties and other relative properties.

The etch stop layer 104, the adhesion layer 105, and the insulating material layer 106 comprise an inter-metal dielectric (IMD) structure in accordance with some embodiments.

FIG. 2 illustrates the stress levels $\sigma_1$ and $\sigma_2$ of the insulating material layer 106 and the adhesion layer 105, respectively, after the deposition process for the insulating material layer 106 and the adhesion layer 105. The stress $\sigma_2$ of the adhesion layer 105 is greater than the stress $\sigma_1$ of the insulating material layer 106 in some embodiments, after the deposition processes for the insulating material layer 106 and the adhesion layer 105.

The semiconductor device 100 is then exposed to ultraviolet (UV) energy 110, as shown in FIG. 3. The UV energy 110 exposure may comprise a duration of about 30 seconds to about 10 minutes, for example. Alternatively, the UV energy 110 exposure may comprise other time periods. In some embodiments, the UV energy 110 exposure is adapted to cure the insulating material layer 106.

The UV energy 110 exposure increases the mechanical strength of the more porous insulating material layer 106. The UV energy 110 exposure also results in an increase in the stress of the insulating material layer 106 and the adhesion layer 105, as illustrated by $\sigma_1'$ and $\sigma_2'$ in FIG. 3. In some embodiments, a larger stress increment is achieved for the adhesion layer 105 than for the insulating material layer 106. The adhesion layer 105 having a greater density and more mechanical strength generates a higher tensile stress than the stress of insulating material layer 106, which is more porous.

In accordance with some embodiments, the adhesion layer 105 comprises a material adapted to optimize a stress difference ($\Delta\sigma$) or delta-stress of the adhesion layer 105 and the insulating material layer 106 to within a range of about +10 MPa to about +30 MPa after the UV energy 110 exposure. For example, $\Delta\sigma = \sigma(\text{adhesion layer})' - \sigma(\text{insulating material layer})'$, wherein $\sigma(\text{adhesion layer})'$ comprises a stress $\sigma_2'$ of the adhesion layer 105 after the UV energy 110 exposure shown in FIG. 3, and wherein $\sigma(\text{insulating material layer})'$ comprises a stress $\sigma_1'$ of the insulating material layer 106 after the UV energy 110 exposure. A material of the adhesion layer 105 is selected to optimize Equation 1 in some embodiments:

$$\Delta\sigma = \sigma_2' - \sigma_1'. \qquad \text{Eq. 1:}$$

In embodiments wherein the adhesion layer 105 comprises a material that achieves a post-UV delta-stress $\Delta\sigma$ of about +10 MPa to about +30 MPa after the UV energy 110 exposure, adhesion is increased by greater than about 5% in some embodiments. In other embodiments wherein the adhesion layer 105 comprises a material that achieves a post-UV delta-stress $\Delta\sigma$ of about +13 MPa to about +25 MPa after the UV energy 110 exposure, adhesion may be increased by greater than about 15%. In yet other embodiments wherein the adhesion layer 105 comprises a material that achieves a post-UV delta-stress $\Delta\sigma$ of about +18 after the UV energy 110 exposure, adhesion may be increased by greater than about 25%, as another example. Alternatively, the adhesion may be increased by other amounts.

In some embodiments, the adhesion layer 105 has a larger stress increase after the UV exposure 110 and cure process, due to a larger amount of Si—O bonding, resulting in a shear force at the interface of the adhesion layer 105 and the insulating material layer 106. However, in accordance with embodiments of the present disclosure, optimization of the adhesion layer 105 stress can be achieved to optimize the adhesive properties of the adhesion layer 105. Optimizing the adhesion layer 105 stress after UV energy 110 exposure is an important factor for good adhesion of the hybrid IMD scheme, in some embodiments.

Figure 4:
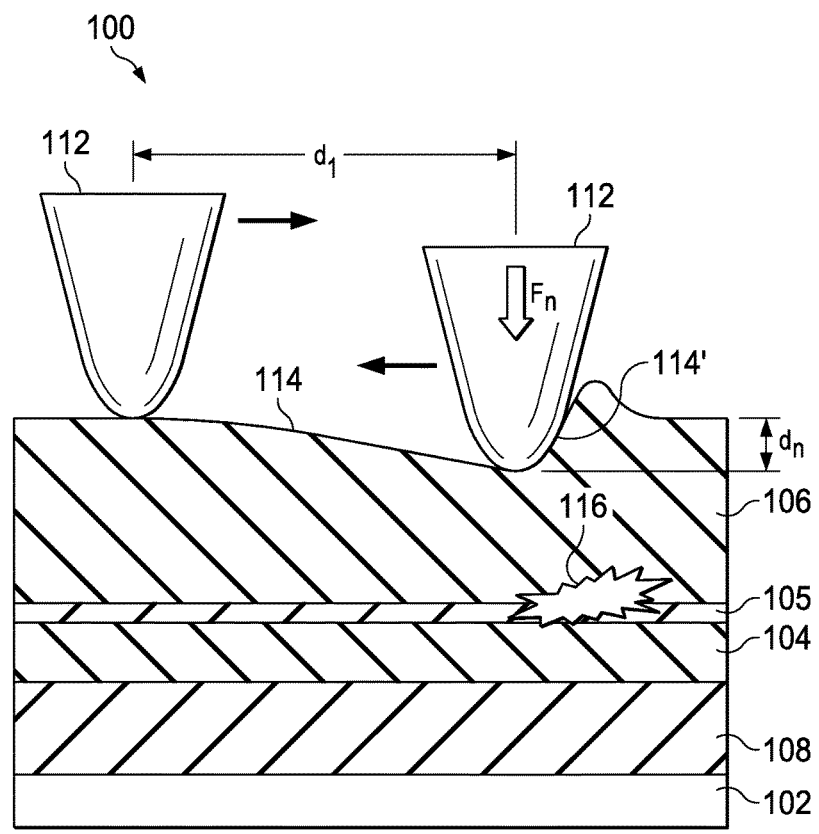
FIG. 4 is a cross-sectional view of a semiconductor device in accordance with some embodiments, illustrating a scratch test.

FIG. 4 is a cross-sectional view of a semiconductor device 100 in accordance with some embodiments, illustrating a scratch test that can be performed to gauge the effectiveness of the adhesion layer 105. The material stack of the semiconductor device 100 includes the material layers 104, 105, and 106 previously described herein, and also includes an oxide layer 108 comprising an oxide such as silicon dioxide disposed between the workpiece 102 and the etch stop layer 104. Experimental results are illustrated wherein the material stack included a etch stop layer 104 comprising a thickness of greater than about 2,500 Angstroms, an adhesion layer 105 comprising a thickness of about 50 to 200 Angstroms, and an insulating material layer 106 comprising a thickness of about 3,000 to 3,500 Angstroms.

Figure 5:
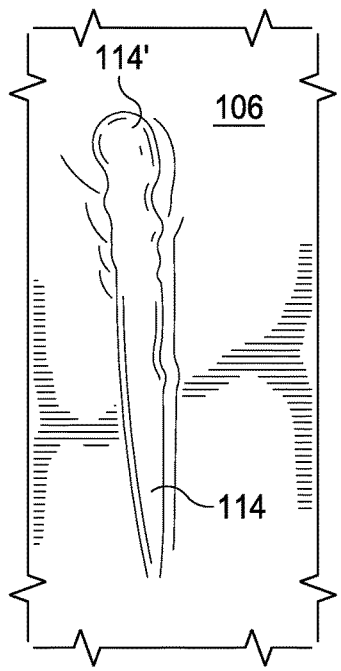
FIG. 5 is a top view of the semiconductor device shown in FIG. 4 after the scratch test.

In the scratch test which is used to test adhesive properties of the material stack, a stylus 112 is used to scratch the top surface of the insulating material layer 106 by applying a downward force $F_n$ while moving the stylus 112 a predetermined distance $d_1$ across the top surface of the insulating material layer 106, forming a scratch 114. The depth $d_n$ of the scratch 114 may comprise a depth less than the total thickness of insulating material layer 106, for example. The scratch test is completed when the stylus 112 reaches position 112' creating the deepest point 114' of the scratch 114. In some embodiments, damage 116 comprising a delamination or region of lack of adhesion (e.g., an interface adhesion failure) may be observed at the interface of the adhesion layer 105 and the insulating material layer 106. The scratch test comprises a destructive test in some embodiments, for example, wherein an amount of force $F_n$ required to cause the damage 116 is determinable. The degree of adhesion is indicated by the critical force $F_n$ required to cause the damage. FIG. 5 is a top view of the semiconductor device 100 after the scratch test shown in FIG. 4.

Figure 6:
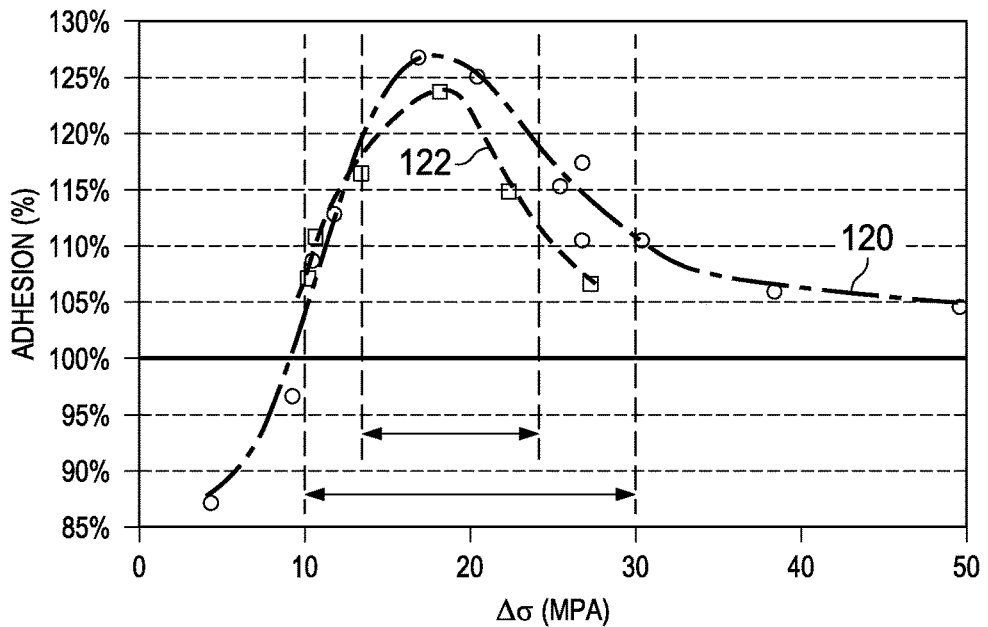
FIG. 6 is a graph illustrating adhesion properties versus change in stress of semiconductor devices in accordance with some embodiments.

FIG. 6 is a graph illustrating adhesion properties versus change in stress of semiconductor devices in accordance with some embodiments, in accordance with experimental test results. Adhesion in % of a hybrid IMD including an adhesion layer 105 and a porous insulating material layer 106 having a dielectric constant of about 2.3 over a range of delta-stress $\Delta\sigma$ values is shown at 120. Optimization of the adhesion % was achieved in $\Delta\sigma$ values of about 10 to 30 MPa. Adhesion in % of a hybrid IMD including an adhesion layer 105 and a porous insulating material layer 106 having a dielectric constant of about 2.4 over a range of delta-stress $\Delta\sigma$ values is shown at 122. Optimization of the adhesion % was achieved in $\Delta\sigma$ values of about 13 to about 25 MPa.

Figure 7:
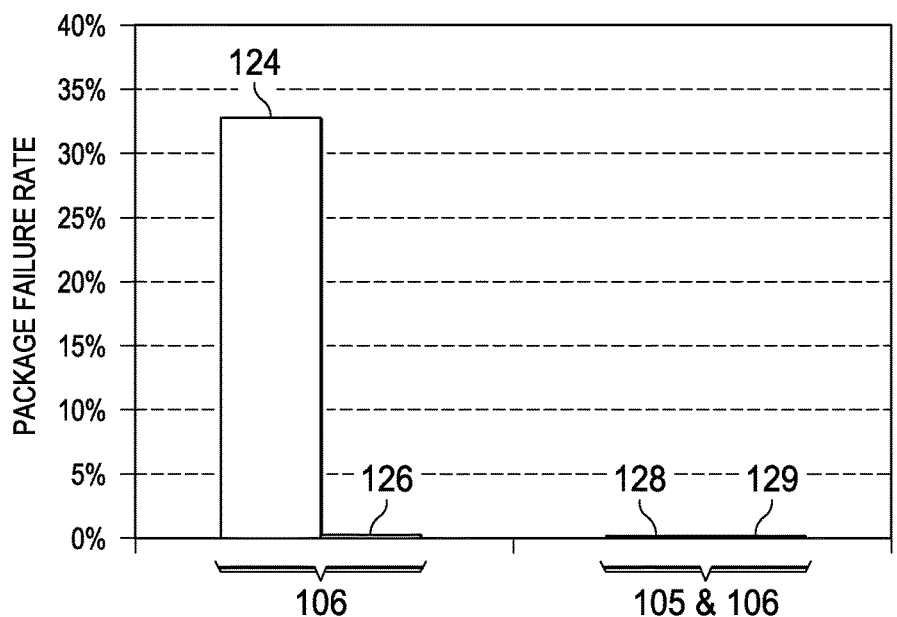
FIG. 7 is a chart illustrating bondability performance of semiconductor devices in accordance with some embodiments.

FIG. 7 is a chart illustrating bondability performance of semiconductor devices 100 in accordance with some embodiments. Experimental test results are shown without the inclusion of the novel adhesion layer 105 at 106 in FIG. 7 (e.g., using only the porous insulating material layer 106 as an IMD) and with the inclusion of the adhesion layer 105 in the IMD at (105+106) in FIG. 7. The insulating material layer 106 comprised a dielectric constant of about 2.3 and a hardness (H) of about 1.2 GPa. The adhesion layer 105 comprised a porous adhesion layer 105 having a dielectric constant of 2.6, a thickness of about 150 Angstroms, and a $\Delta\sigma$ of about +18 MPa. A package failure rate advantageously decreased from about 33% to 0% by implementing the novel adhesion layer 105 described herein, as shown at 124, 126, 128, and 129.

Figure 8:
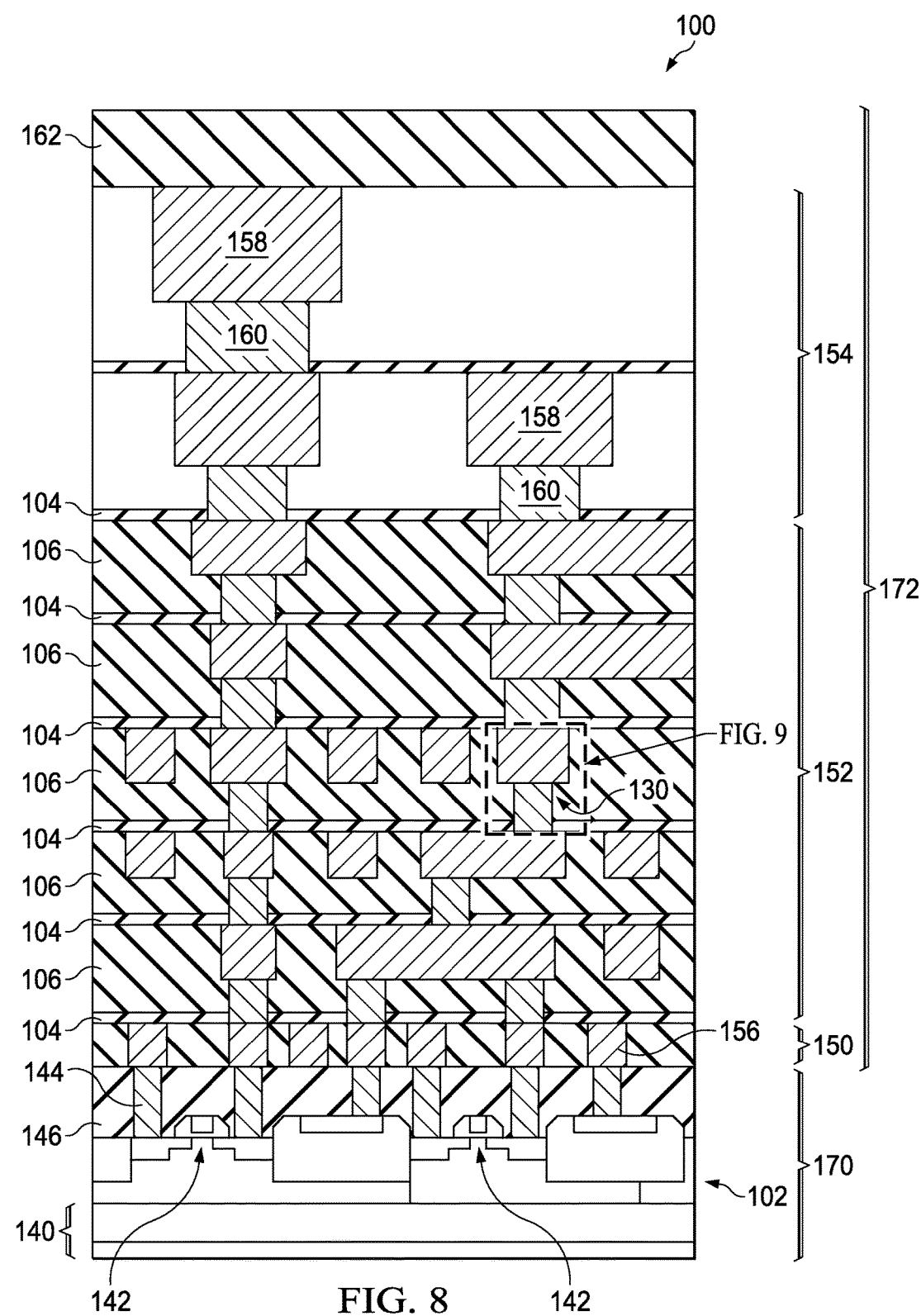
FIG. 8 is a cross-sectional view of a semiconductor device in accordance with some embodiments.

FIG. 8 is a cross-sectional view of a semiconductor device 100 in accordance with some embodiments that includes the adhesion layer 105 (not shown in FIG. 8; see FIG. 9) and insulating material layer 106 described herein. The semiconductor device 100 includes a workpiece 102 comprising a substrate 140 and a plurality of transistors 142 or other electronic devices formed over the substrate 140. An insulating material 146 is disposed over the transistors 142 and contacts 144 are formed in the insulating material 146 that provide electrical connections between portions of the transistors 142 and metallization layer 150. Layer 150 comprises a first metallization layer that includes wiring 156 for the semiconductor device 100. An IMD 152 including a plurality of conductive features 130, etch stop layers 104, insulating material layers 106, and adhesion layers 105 (see FIG. 9) is disposed over the metallization layer 150. Global wiring 154 including wiring 158 and vias 160 is formed over the IMD 152. An insulating material 162 is formed over the global wiring 154 in some embodiments.

The transistors 142 and/or other electronic devices are formed in a front-end-of-line (FEOL) process in some embodiments, as indicated at 170. The metallization layer 150, IMD 152, and global wiring 154 are formed in a back-end-of-line (BEOL) process in some embodiments, as indicated at 172. Alternatively, the various material layers of the semiconductor device 100 may be formed in other processing schemes.

Figure 9:
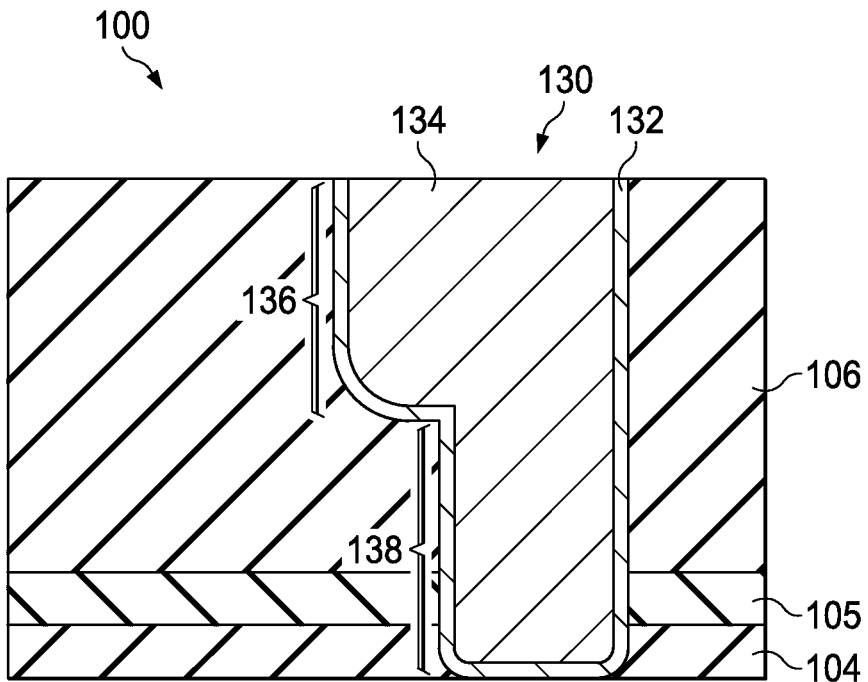
FIG. 9 is a more detailed cross-sectional view of a portion of the semiconductor device shown in FIG. 8 in accordance with some embodiments.

A more detailed view of a portion of the semiconductor device 100 that includes the adhesion layer 105 and insulating material layer 106 described herein is shown in a cross-sectional view in FIG. 9, which illustrates a conductive feature 130 formed or disposed within the insulating material layer 106, the adhesion layer 105, and at least a portion of the etch stop layer 104. In some embodiments, the conductive feature 130 is also formed within an entire thickness of the etch stop layer 104. Only one conductive feature 130 is shown in FIG. 8; however, a plurality of conductive features 130 may be formed across the workpiece 102 in accordance with some embodiments of the present disclosure, as shown in FIG. 8. A plurality of conductive features 130 may be formed in a plurality of insulating material layers 106, adhesion layers 105, and etch stop layers 104 in a multiple layer interconnect or metallization structure, as shown in FIG. 8.

Referring again to FIG. 9, the conductive feature 130 may include a conductive liner or barrier layer 132 and a conductive material 134 disposed over the conductive liner or barrier layer 132. The conductive liner or barrier layer 132 may comprise a seed layer in some embodiments, for example. The liner or barrier layer 132 may comprise a single material layer or a plurality of material layers, for example.

A dual damascene pattern conductive feature 130 is shown in FIG. 9. The dual damascene conductive feature 130 includes a conductive line portion 136 and a via portion 138 coupled to the conductive line portion 136. Alternatively, a single damascene conductive feature 130 may be formed in the insulating material layer 106, adhesion layer 105, and etch stop layer 104, not shown.

To form the conductive feature 130, the semiconductor device 100 is patterned with a desired pattern for the conductive feature 130. For example, the insulating material layer 106 and adhesion layer 105 are patterned using a lithography process, using the etch stop layer 104 as an etch stop. For example, a layer of photoresist (not shown) may be deposited over the insulating material layer 106. The layer of photoresist is patterned using lithography with a desired pattern for insulating material layer 106. The layer of photoresist may be patterned by exposing the layer of photoresist to energy transmitted through or reflected from a lithography mask having a desired pattern thereon. The layer of photoresist is developed, and then exposed or unexposed portions (depending on whether the photoresist is positive or negative) of the photoresist are ashed or etched away. The insulating material layer 106 and adhesion layer 105 are then exposed to an etch process, removing portions of the insulating material layer 106 and adhesion layer 105 not covered by the layer of photoresist. Portions of or an entire thickness of the etch stop layer 104 may also be removed during the etch process. The layer of photoresist is then removed.

The insulating material layer 106 is patterned using a dual damascene process in accordance with some embodiments to form patterns for conductive features. For example, the patterns for conductive features in the insulating material layer 106 may comprise upper portions that comprise patterns for conductive lines 136 and lower portions in the insulating material layer 106, adhesion layer 105, and etch stop layer 104 that comprise patterns for conductive vias 138. Two photoresist layers, photolithography steps, and etch steps may be used to form the pattern in the insulating material layer 106, adhesion layer 105, and etch stop layer 104; one photolithography and etch step to form the conductive line portions of the patterns and another photolithography and etch step to form the via portions of the patterns, for example. A via-first or a conductive line-first dual damascene method may be used. Alternatively, the via and conductive line patterns may be separately patterned using two lithography steps onto a single layer of photoresist, and then etched simultaneously. In some embodiments, the insulating material layer 106, adhesion layer 105, and etch stop layer 104 may be directly patterned with the dual damascene patterns. Other dual damascene methods may also be used to form the patterns in the insulating material layer 106, adhesion layer 105, and etch stop layer 104.

The etch stop layer 104 functions as an endpoint detector in the etch process used to pattern the insulating material layer 106, adhesion layer 105, and etch stop layer 104; e.g., the etch process used to form the lower via portion of the conductive feature pattern. The chemicals in the chamber the semiconductor device 100 is placed in for the etch process may be monitored to detect one or more components of the etch stop layer 104, for example. When the one or more components of the etch stop layer 104 is detected, the etch process is discontinued, for example. The thickness of etch stop layer 104 may be selected so that substantially all of etch stop layer 104 is removed when the etch process reaches the etch stop layer 104 or so that some of the etch stop layer 104 is left remaining, for example, in some embodiments. In other embodiments, the endpoint detection system or method may involve monitoring chemicals of the etch process to detect when one or more components of etch stop layer 104 ceases to be detected, upon which point the etch process is discontinued, as another example. Alternatively, other types of endpoint detection methods may be used to determine when the etch stop layer 104 has been reached, indicating that the etch process for the insulating material layer 106 and adhesion layer 105 should be discontinued.

The liner or barrier layer 132 is then deposited in some embodiments, lining the patterns in the insulating material layer 106, adhesion layer 105, and etch stop layer 104. In some embodiments, the liner or barrier layer 132 is not included. The conductive material 134 is then deposited or formed over liner or barrier layer 132, or over the patterned insulating material layer 106, adhesion layer 105, and etch stop layer 104, if the liner or barrier layer 132 is not included. The conductive material 134 comprises copper, a copper alloy, a conductive liner, a seed layer, other conductors, or combinations or multiple layers thereof, as examples. The conductive material 134 may be sputtered on, or formed by CVD, PVD, or plating, as examples. Alternatively, the conductive material 134 may comprise other materials and may be formed using other methods. The conductive material 134 fills the patterns in the insulating material layer 106, adhesion layer 105, and etch stop layer 104 over the liner or barrier layer 132.

A chemical-mechanical polishing (CMP) process, grinding process, and/or etch process is then used to remove excess conductive material 134 from over the top surface of the insulating material layer 106, forming conductive features 130 from the conductive material 134 and liner or barrier layer 132 within the insulating material layer 106, adhesion layer 105, and etch stop layer 104. The conductive features 130 comprise upper portions that comprise conductive line portions 136 and lower portions that comprise via portions 138. The upper conductive line portions of the conductive features 130 may extend in-and-out of the paper in the view shown by a predetermined distance, and may have meandering, straight, or other patterns (in a top view of the workpiece 102. The via portions of the conductive features 130 may be round, oval, square or other shapes in a top view of the workpiece 102.

After the manufacturing process step shown in FIG. 9, the fabrication process for the semiconductor device 100 is then continued, as shown in FIG. 8. Additional material layers, such as additional conductive material layers of IMD 152, global wiring 154, and insulating material 162, may be formed over the semiconductor device 100, and individual integrated circuits may be singulated from the semiconductor device 100 and later packaged in single packages, multi-chip packages, or directly mounted in an end application (also not shown).

Figure 10:
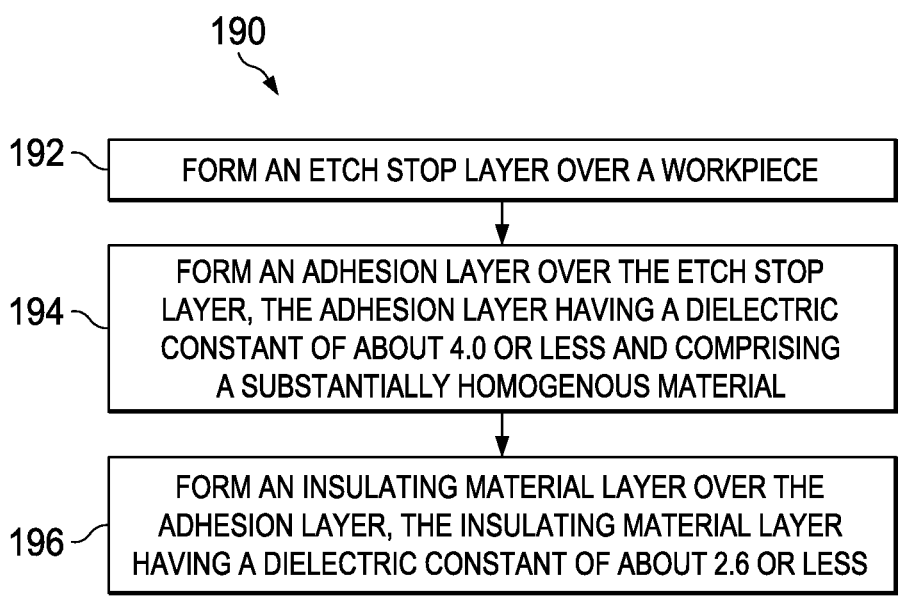
FIG. 10 is a flow chart of a method of manufacturing a semiconductor device in accordance with some embodiments.

FIG. 10 is a flow chart 190 of a method of manufacturing a semiconductor device 100 in accordance with some embodiments. In step 192, an etch stop layer 104 is formed over a workpiece 102 (see also FIG. 1). In step 194, an adhesion layer 105 is formed over the etch stop layer 104, the adhesion layer 105 having a dielectric constant of about 4.0 or less and comprising a substantially homogeneous material. In step 196, an insulating material layer 106 is formed over the adhesion layer 105, the insulating material layer 106 having a dielectric constant of about 2.6 or less.

Advantages of some embodiments of the disclosure include providing novel BEOL (back-end of line) interconnect structures for semiconductor devices 100 and methods of manufacture thereof that include hybrid IMD structures. The material selection for the novel adhesion layer 105 may comprise either oxide or carbon-doped oxide materials in accordance with the post-UV exposure stress tuning techniques described herein. The adhesion layers 105 may comprise porous or non-porous films and are capable of improving interface strength. A hybrid IMD structure that includes the adhesion layer 105 and a porous low dielectric constant insulating material layer 106 can be deposited within the same PECVD chamber using the same chemical precursors. In embodiments wherein the adhesion layer 105 comprises a porous material, an IMD scheme with a lower effective dielectric constant or k value and better capacitance (Ct) performance (e.g., resulting in a reduction in capacitance in some embodiments) is advantageously achievable.

The advanced IMD structures provide a high interface strength and less capacitance degradation. Adhesion strength and bondability are improved. The novel hybrid IMD structures can be implemented without incurring additional process tools or costs. In addition, the novel hybrid IMD structures and designs are easily implementable in manufacturing process flows.

In accordance with some embodiments of the present disclosure, a semiconductor device includes an adhesion layer disposed over a workpiece, the adhesion layer having a dielectric constant of about 4.0 or less and comprising a substantially homogeneous material. The semiconductor device includes an insulating material layer disposed over the adhesion layer, the insulating material layer having a dielectric constant of about 2.6 or less. The adhesion layer and the insulating material layer comprise an IMD structure.

In accordance with other embodiments, an IMD structure includes an etch stop layer and an adhesion layer disposed over the etch stop layer. The adhesion layer has a dielectric constant of about 4.0 or less and comprises a substantially homogeneous material. An insulating material layer is disposed over the adhesion layer. The insulating material layer has a dielectric constant of about 2.6 or less and is more porous than the adhesion layer.

In accordance with other embodiments, a method of manufacturing a semiconductor device includes forming an etch stop layer over a workpiece, and forming an adhesion layer over the etch stop layer. The adhesion layer has a dielectric constant of about 4.0 or less and comprises a substantially homogeneous material. The method includes forming an insulating material layer over the adhesion layer. The insulating material layer has a dielectric constant of about 2.6 or less. The etch stop layer, the adhesion layer, and the insulating material layer comprise an IMD structure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a dielectric adhesion layer disposed over a workpiece, the dielectric adhesion layer having a dielectric constant of about 4.0 or less and comprising a substantially homogeneous material, wherein the adhesion layer comprises a porosity of about 20% or less; and
    an insulating material layer disposed over the dielectric adhesion layer, the insulating material layer having a dielectric constant of about 2.6 or less.

2. The semiconductor device according to claim 1, wherein the adhesion layer comprises an oxide or a carbon-doped oxide.

3. The semiconductor device according to claim 1, wherein the adhesion layer comprises a thickness of about 50 Angstroms to about 250 Angstroms.

4. The semiconductor device according to claim 1, wherein the insulating material layer comprises a porosity of about 0%.

5. The semiconductor device according to claim 1, wherein the adhesion layer or the insulating material layer comprises SiOH:C.

6. An inter-metal dielectric (IMD) structure, comprising:
    an etch stop layer;
    an adhesion layer disposed over the etch stop layer, the adhesion layer having a dielectric constant of about 4.0 or less and comprising a substantially homogeneous material; and
    an insulating material layer disposed over and in contact with the adhesion layer, the insulating material layer having a dielectric constant of about 2.6 or less, wherein the insulating material layer is more porous than the adhesion layer.

7. The IMD structure according to claim 6, further comprising a conductive feature disposed within the insulating material and the adhesion layer.

8. The IMD structure according to claim 7, wherein the conductive feature is disposed within a portion of the etch stop layer.

9. The IMD structure according to claim 7, wherein the conductive feature is disposed within an entire thickness of the etch stop layer.

10. The IMD structure according to claim 6, wherein the conductive feature comprises a conductive line portion.

11. The IMD structure according to claim 10, wherein the conductive feature comprises a via portion coupled to the conductive line portion.

12. The IMD structure according to claim 6, wherein the conductive feature comprises a conductive liner or a barrier layer and a conductive material disposed over the conductive liner or barrier layer.

13. A method of manufacturing a semiconductor device, the method comprising:
    forming an etch stop layer over a workpiece;

forming an adhesion layer over the etch stop layer, the adhesion layer having a dielectric constant of about 4.0 or less and comprising a substantially homogeneous material, and wherein the adhesion layer comprises a porosity of about 20% or less;

forming an insulating material layer over the adhesion layer, the insulating material layer having a dielectric constant of about 2.6 or less, wherein the etch stop layer, the adhesion layer, and the insulating material layer form an inter-metal dielectric (IMD);

forming a via extending through the insulating material layer, the adhesion layer, and the etch stop layer; and forming a conductive line extending over the via.

14. The method according to claim 13, wherein forming the adhesion layer or forming the insulating material layer comprises a plasma enhanced chemical vapor deposition (PECVD) process.

15. The method according to claim 14, wherein the PECVD process comprises two precursors.

16. The method according to claim 14, wherein the PECVD process comprises an alkoxysilane-based group precursor and a porogen material precursor.

17. The method according to claim 16, wherein the porogen material precursor comprises an ultraviolet (UV)-sensitive alkyl-based group precursor.

18. The method according to claim 13, further comprising exposing the semiconductor device to ultraviolet (UV) energy, after forming the insulating material layer.

19. A method of manufacturing a semiconductor device, the method comprising:

forming an etch stop layer over a workpiece;

forming an adhesion layer over the etch stop layer, the adhesion layer having a dielectric constant of about 4.0 or less and comprising a substantially homogeneous material;

forming an insulating material layer over the adhesion layer, the insulating material layer having a dielectric constant of about 2.6 or less, wherein the etch stop layer, the adhesion layer, and the insulating material layer form an inter-metal dielectric (IMD); and exposing the semiconductor device to ultraviolet (UV) energy, after forming the insulating material layer, wherein the adhesion layer comprises a material adapted to optimize a stress difference ($\Delta\sigma$) of the adhesion layer and the insulating material layer to within a range of about +10 MPa to about +30 MPa after the UV energy exposure, wherein $\Delta\sigma=\sigma(\text{adhesion layer})'-\sigma(\text{insulating material layer})'$, wherein $\sigma(\text{adhesion layer})'$ comprises a stress of the adhesion layer after the UV energy exposure, and wherein $\sigma(\text{insulating material layer})'$ comprises a stress of the insulating material layer after the UV energy exposure.

* * * * *